(12) United States Patent
Beroz

(10) Patent No.: US 8,963,013 B2
(45) Date of Patent: Feb. 24, 2015

(54) THREE DIMENSIONAL INTERPOSER DEVICE

(76) Inventor: Masud Beroz, Apex, NC (US)

(*) Notice: Subject to any disclaimer, the term of this patent is extended or adjusted under 35 U.S.C. 154(b) by 359 days.

(21) Appl. No.: 13/311,501

(22) Filed: Dec. 5, 2011

(65) Prior Publication Data

US 2012/0138343 A1  Jun. 7, 2012

Related U.S. Application Data

(60) Provisional application No. 61/549,077, filed on Dec. 7, 2010, provisional application No. 61/420,815, filed on Dec. 8, 2010, provisional application No. 61/423,985, filed on Dec. 16, 2010.

(51) Int. Cl.
*H05K 1/03* (2006.01)
*H05K 7/10* (2006.01)
*H01L 21/48* (2006.01)
*H01L 23/498* (2006.01)
*G01R 1/04* (2006.01)
*G01R 1/073* (2006.01)

(52) U.S. Cl.
CPC ............ *H05K 7/1061* (2013.01); *H01L 21/486* (2013.01); *H01L 23/49827* (2013.01); *H01L 23/49833* (2013.01); *G01R 1/0416* (2013.01); *G01R 1/07378* (2013.01); *H01L 23/49838* (2013.01); *H01L 2924/09701* (2013.01); *H01L 2924/12044* (2013.01); *H01L 2924/0002* (2013.01)
USPC ....................................... 174/255

(58) Field of Classification Search
CPC ...... H05K 3/46; H05K 3/4644; H05K 1/0284; H05K 1/119; H05K 1/0296; H05K 1/117; H01L 24/01; H01L 24/02
USPC .......... 174/255, 250, 253, 256, 261, 264, 267
See application file for complete search history.

(56) References Cited

U.S. PATENT DOCUMENTS

| 6,563,210 B2 | 5/2003 | Sankman | |
|---|---|---|---|
| 2002/0142513 A1* | 10/2002 | Fee et al. | 438/106 |
| 2007/0232090 A1 | 10/2007 | Colgan et al. | |
| 2009/0300914 A1* | 12/2009 | Hougham et al. | 29/874 |

FOREIGN PATENT DOCUMENTS

| EP | 1344435 B1 | 5/2008 |
|---|---|---|
| WO | 02/51222 A2 | 6/2002 |

* cited by examiner

*Primary Examiner* — Tremesha S Willis
(74) *Attorney, Agent, or Firm* — Garrett IP, L.L.C.

(57) ABSTRACT

A three-dimensional grid array interposer includes first and second arrays of electrical terminals arranged in grid-like patterns having grid pitches of (X1,Y1) and (X2,Y2), where each electrical terminal of the first array corresponds to an electrical terminal of the second array, forming a corresponding pair of electrical terminals. The interposer also includes a plurality of stacked substrates, each substrate having a first surface, a second surface, a first edge, and a second edge, with each substrate having a row of electrical terminals of the first array along the first surface at the first edge and a row of electrical terminals of the second array along the first surface at its second edge, with a trace running along the first surface between each electrical terminal of each corresponding pair of electrical terminals. Spacers can be used to provide desired space transformation.

23 Claims, 17 Drawing Sheets

ISO. TOP VIEW

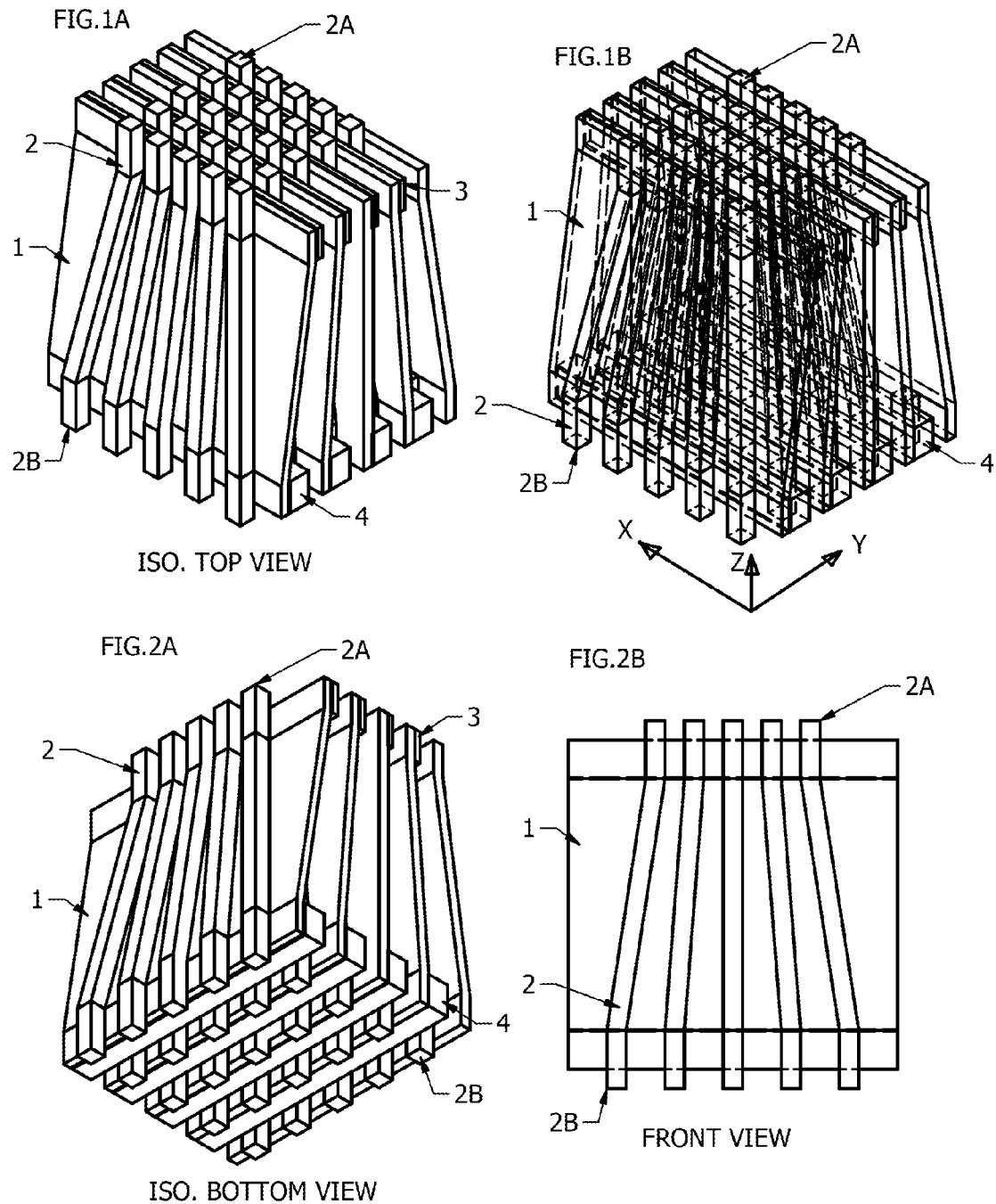

TOP VIEW

FRONT VIEW

SIDE VIEW

BOTTOM VIEW

ISO. TOP VIEW  ISO. BOTTOM VIEW

ISO. TOP VIEW

ISO. TOP VIEW (HIDDEN EDGES VISIBLE)

ISO. TOP VIEW

ISO. BOTTOM VIEW

ISO. TOP VIEW

SIDE VIEW

TOP VIEW

SIDE VIEW

ISO. TOP VIEW

FRONT VIEW

ISO. TOP VIEW

ISO. TOP VIEW

FRONT VIEW

ISO. TOP VIEW

TOP VIEW

ISO. TOP VIEW

RIGHT VIEW

ISO. TOP VIEW

TOP VIEW

RIGHT VIEW

FRONT VIEW

ISO. TOP VIEW

SIDE VIEW

TOP VIEW

FRONT VIEW

SECTION A-A
SCALE 3 : 1

THREE DIMENSIONAL INTERPOSER DEVICE

RELATED APPLICATIONS

This application claims the benefit of U.S. Provisional Patent Application No. 61/459,077, filed Dec. 7, 2010, U.S. Provisional Patent Application No. 61/420,815, filed Dec. 8, 2010, and U.S. Provisional Patent Application No. 61/423,985, filed Dec. 16, 2010, the disclosures of which are hereby incorporated herein by reference in their entireties.

FIELD OF THE DISCLOSURE

The present disclosure relates to an electronics substrate interconnect device also known as an interposer, which interconnects various electronics components to each other.

BACKGROUND

The disclosure herein relates to an electronic interconnect device, also known as an interposer device, used for interfacing densely populated devices such as semiconductor chips or chip scale packages to each other, or to loosely populated electronics devices such as printed circuit boards.

An interposer device can transform a fine pitch I/O (input/output) footprint to a coarse pitch I/O footprint. There are various reasons for such a transformation. The main board manufacturers do not have the capability to route conductors very close to each other, either because of the technological limitations at their factory or cost issues. There is also a reliability issue: the thermal expansion mismatch between different semiconductor devices and printed circuit boards makes the fine pitch joining extremely unreliable. Therefore the use of an interposer between semiconductor chips, such as processors, logic, ASIC and memory chips, and printed circuit boards is very common. Quite often the function of the interposer is integrated into chip packages and production sockets.

Conventionally, semiconductor components are interfaced onto a printed wiring board having a multilayer structure, where pluralities of electrical conductor layers are stacked sequentially with an insulating layer such as FR4 in between. The electrical continuity between each conductor layer is achieved through metallically plated vias. On each consecutive layer, the conductors are distributed a little outward until the desired coarse pitch has been reached.

One example of a typical structure can be found in U.S. Patent Application Publication Number 2007/0232090 A1 to Colgan et al. Conventionally, a build-up process is used as a technology for manufacturing a wiring board of a multilayer structure. With the use of the build-up process, a variety of multilayer wiring boards can be fabricated by varying the combination of a material (typically, a thermosetting resin) for an interlayer dielectric and using a via hole formation process.

A typical manufacturing process for a multilayer wiring board using the build-up process is to repeat, in turn, the formation of an insulating layer, the formation of a via hole in the insulating layer, and the formation of a wiring pattern on the insulating layer and also in the via hole, on both or either surface of a core substrate serving as a support base member. In such a structure, wiring layers and insulating layers can be thinly formed since the build-up process is used for their stacking, while the core substrate requires an appropriate thickness for affording the wiring board rigidity. Similarly connecting two opposite sides of the rigid or flexible electronics substrates, such as organic or inorganic substrates, requires the formation of through vias and subsequently the metallization of the formed vias.

BRIEF DESCRIPTION OF THE DRAWINGS/FIGURES

The accompanying drawing figures incorporated in and forming a part of this specification illustrate several aspects of the disclosure, and together with the description serve to explain the principles of the disclosure.

FIGS. 1A and 1B show two isometric top views, one with all edges visible, of a space transforming interposer structure, according to embodiments of the present disclosure.

FIGS. 2A and 2B show an isometric bottom view, and a front view of the space transforming interposer of FIG. 1A, according to embodiments of the present disclosure.

DESCRIPTION OF THE EXEMPLARY EMBODIMENTS

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The disclosure herein relates to an electronic interconnect device, also known as an interposer device, used for interfacing densely populated devices such as semiconductor chips or chip scale packages to each other or to loosely populated electronics devices such as printed circuit boards. As described above, a typical interposer can serve several functions such as space transformation and mechanical stress decoupling, by simply creating an interconnect between two opposite sides of a substrate. In order to connect the closely packed I/O terminals of, for example, a microprocessor to a printed circuit board, an interposer can be used to transform the closely packed terminals of the microprocessor to the loosely packed terminals of the printed circuit board. Additionally, the thermally induced mechanical stress between the semiconductor die and the printed circuit board needs to be thermally decoupled by using material with the proper mechanical properties of the interposer.

One object of this disclosure is to provide a reliable and high performance solution for converting a fine pitch grid to a coarse pitch grid of electrically conductive electronics device I/O terminals that currently used interposers cannot provide. This disclosure describes the concept structure and method of manufacturing such a device. It is also an objective of this disclosure to provide solutions for a variety of electronics applications such as chip packaging and testing. The present disclosure presents a new interposing solution for high count and densely populated I/O semiconductor chips to be connected to printed circuit boards having coarser pitches.

Furthermore, the device described in this disclosure can offer a unique remedy for the problems induced by thermal expansion mismatch between different electronics devices. The structure discussed herein inherently adds a great stress decoupling function between a printed circuit board and a semiconductor chip. This can be seen in FIG. 5, where, for example, the semiconductor chip (5) is attached on the top of the interposer where the bottom terminals (2B) of the structure under discussion are attached to printed circuit board (6) terminals (6A).

Figure 5:
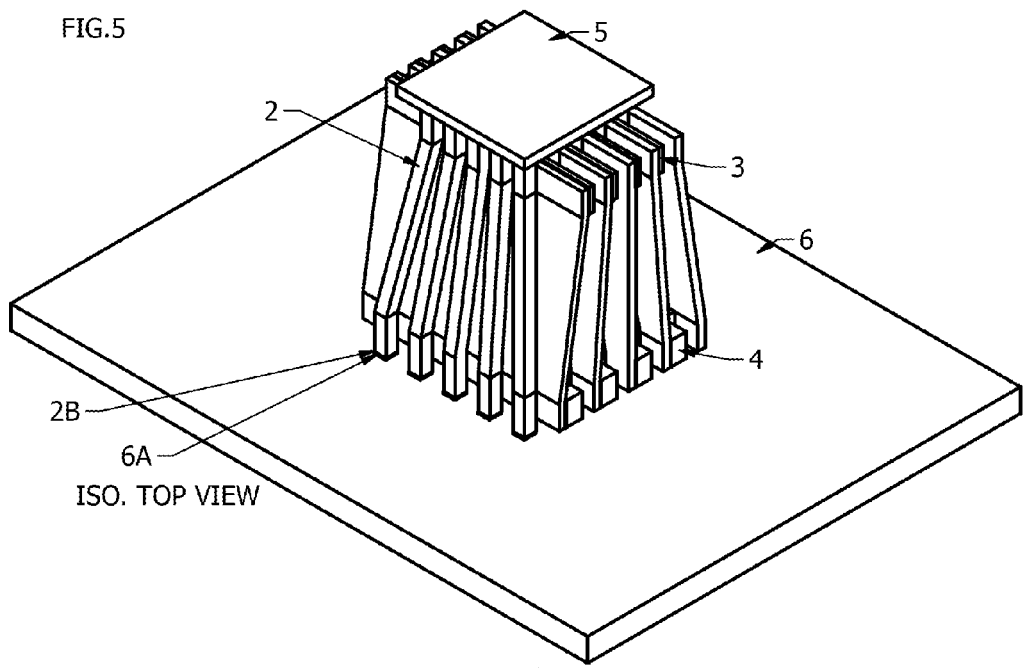
FIG. 5 illustrates an example of the space transforming device being used between a semiconductor chip and a printed circuit board as a direct interposer, according to an embodiment of the present disclosure. The semiconductor chip (5) could also be replaced by a chip package.

As also exemplified in FIG. 5, by choosing a proper thermal expansion coefficient (CTE) between the spacer (4) material and printed circuit board (6) material and also between the semiconductor chip (5) and the spacer (3), an extremely efficient mechanical and thermal induced stress decoupling function can be added between the chip (5) and the printed circuit board (6), while insuring the lowest inductance and ohmic resistance between the connecting terminals of chip (5) and circuit board (6).

According to embodiments shown in the various accompanying figures, an interconnect interposer is provided by joining (e.g., laminating, anodic bonding, diffusion bonding, etc.) a plurality of electrically circuitized substrates on top of each other (e.g., stacked), with no vias or electrical connection between the layers. Conductor leads are formed on each dielectric substrate and, according to an embodiment, they are distributed from a finer spacing to a coarser spacing pitch throughout the length of the substrate. Though various joining methods are mentioned herein, building of the structure is not limited to any particular joining method, and these various methods should not limit the scope of the invention in any way.

According to embodiments shown in the various accompanying figures, stripes of thinner spacers (3) can be placed between two interfacing substrates, based on finer grid spacing between each adjacent layer. Accordingly, stripes of thicker spacers (4) can be placed at the coarser end of the substrates between each adjacent layer. The thickness of each stripe will be calculated to achieve the final X and Y grid spacing while taking into account the thickness of the substrate, adhesive on spacers, and the conductor leads' thickness(es). For example, see FIGS. 7A through 11. It should be noted that the above-described spacers (3) may not be necessary if the combined thickness of the substrate and conductor readily provides the required grid pitch for a particular design.

In an embodiment, as described in more detail below, after the stack of substrates are joined to each other, the structure can be turned 90 degrees and sliced at a right angle to the distribution direction of the conductor leads.

Prior to joining the plurality of substrates (building blocks) together, a window opening can be created around the terminals of the conductors on both ends of the substrate, where the hanging terminals provide flexibility for joining reliability (in case the structure is used as a semiconductor joining interposer or a chip package) and wipe action for a good contact (in case the interposer is used as a probe card).

Referring now to FIG. 1A, FIG. 1A shows an electronics interposer component according to an embodiment of the present disclosure. The electronics interposer component depicted in FIG. 1A comprises a space transforming structure which converts a grid of 5×5 fine pitch terminals (2A) to a grid of 5×5 coarser pitch terminals (2B), using spacers (3) and (4). This exemplary structure is built by laminating 5 pieces of dielectric substrates (building blocks) (1), with preferably metallic traces (2) formed on them. FIGS. 7A through 11 illustrate an exemplary manufacturing process for this structure. It should be noted that although five (5) substrates are used in the example depicted in many of the accompanying figures, the device should not be limited to this exemplary number, as any number of substrates with any number of traces can be used. Furthermore, based on the same principles described in FIGS. 7A through 11, a grid of (n×m) can be built using (n) pieces of building blocks, each having (m) numbers of conducting traces extending from a first edge to at least one of the other edges of a building block.

FIGS. 7A through 8B illustrate a dielectric substrate (1), on which electrically conductive traces (2) are formed, according to embodiments of the present disclosure. The top terminals (2A) are designed to interface a fine pitch grid semiconductor device, where the bottom terminals (2B) are designed to face a coarse pitch printed circuit board. The grid on X direction is transformed by fanning out the leads on each individual building block. The grid on Y direction is transformed by using spacers (3) and (4) with a pre-calculated thickness. In an embodiment, spacer (3) may not be needed if the combined thickness of the substrate and leads are equal to the desired pitch at that particular face.

The exemplary structure depicted in FIG. 1A includes five (5) substrates with electrically conductive leads formed on each, according to an embodiment. Each consecutive layer farther from a geometrical mid plane substrate can be scaled in the Z direction to compensate for the substrate bending needed for space transformation. In this example, it can be assumed that the direction between the terminals on top (2A) and the terminals on the bottom (2B) is the Z direction. FIG. 1B shows the same structure with hidden edges illustrated with dashed lines. In FIG. 1A, (1) is the dielectric substrate where conductive leads (2) are formed. The top conductive terminals (2A) and bottom conductive terminals (2B) can extend beyond the dielectric substrate and spacers in order to achieve better reliability and better flexibility.

Figure 3A:
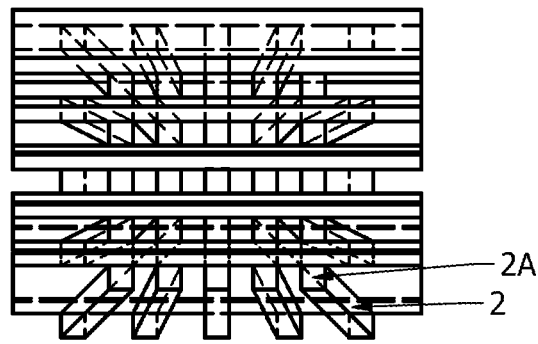
FIGS. 3A through 3D show the structure of the space transforming interposer of FIGS. 1A through 2B from further views, according to embodiments of the present disclosure.
Figure 3B:
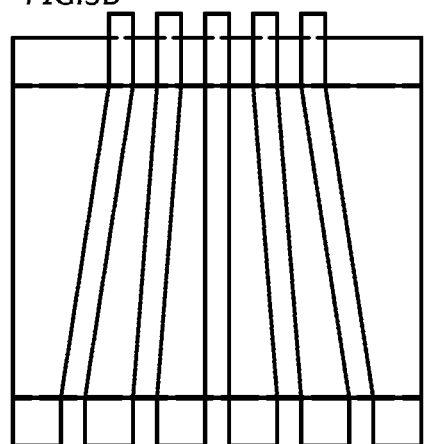
Figure 3C:
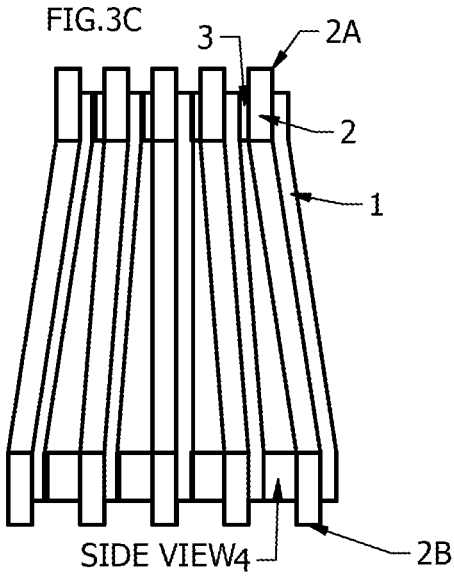
Figure 3D:
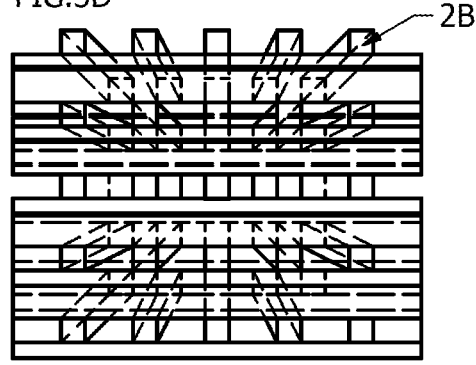
Figure 4A:
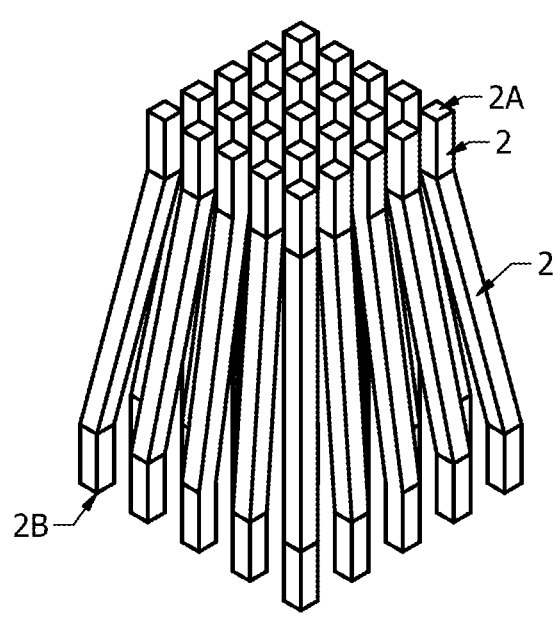
FIGS. 4A and 4B show the electrical interconnects of the space transforming interposer structure from two isometric views to illustrate architecture of the conductor leads, according to embodiments of the present disclosure.
Figure 4B:
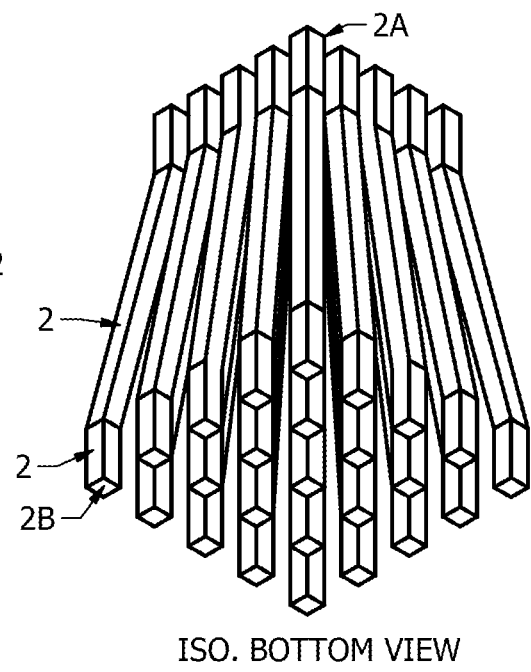

FIGS. 4A and 4B are for illustration purposes only. FIGS. 4A and 4B depict exemplary structure of the electrical conductors showing space transformation, according to an embodiment. In FIGS. 4A and 4B, a finer grid of 5×5 terminals (2A) is transformed into a coarser grid of 5×5 terminals (2B).

Figure 6:
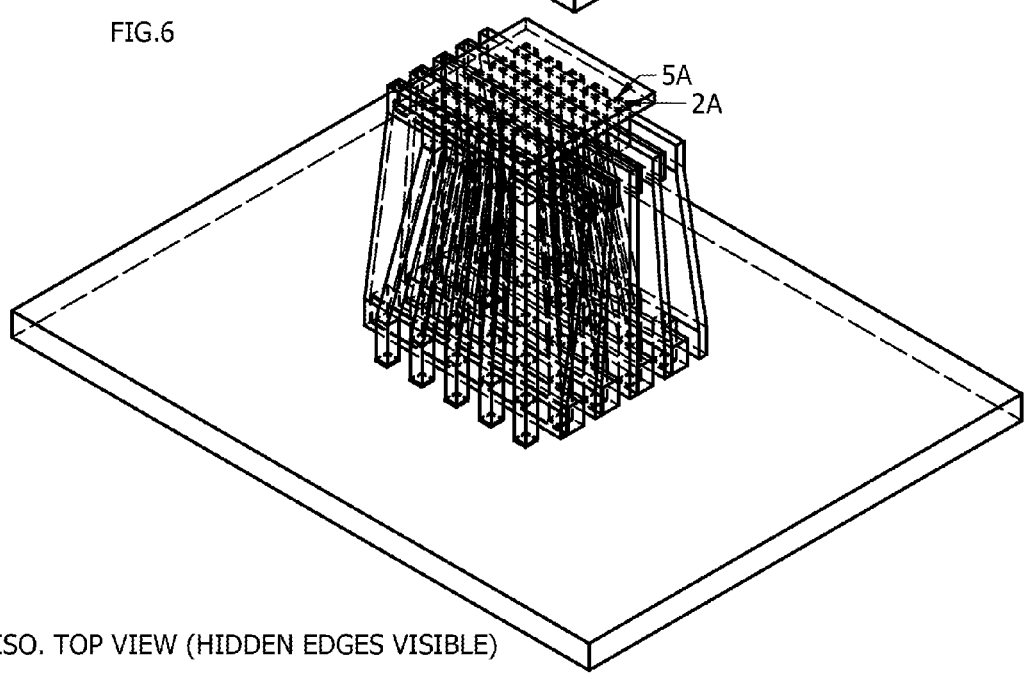
FIG. 6 illustrates the device of FIG. 5, but with all edges visible.
Figure 7A:
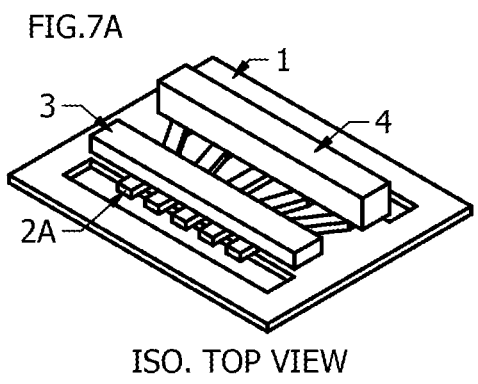
FIGS. 7A and 7B show an exemplary fundamental building block of the space transforming interposer structure, according to an embodiment of the present disclosure, with spacer elements placed thereon.
Figure 7B:
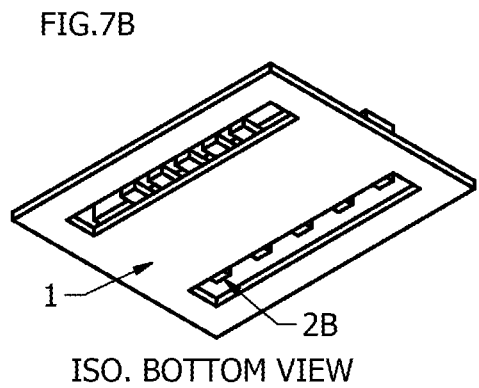
Figure 8A:
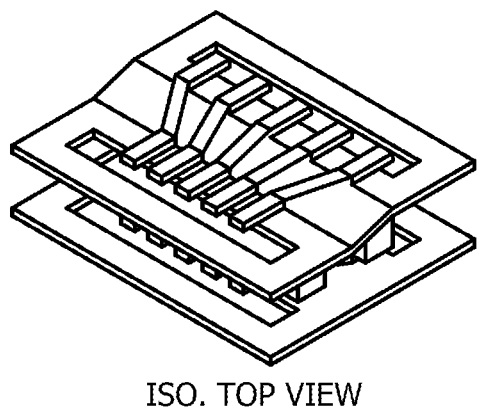
FIGS. 8A and 8B show a second building block stacked on the structure of FIG. 7A, according to an embodiment of the present disclosure.
Figure 8B:
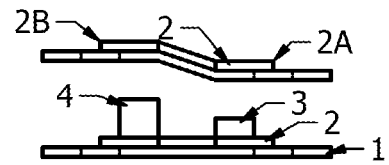

FIGS. 5 and 6 illustrate another embodiment of the disclosure where the device is used in practice. FIGS. 5 and 6 depict a semiconductor chip having fine pitch land grid array terminals connected to a printed circuit board having coarse pitch land grid terminals. In FIGS. 5 and 6, (5) is the semiconductor chip and (5A) is a single terminal on the semiconductor chip. Element (6) is the printed circuit board and (6A) is one of the I/O terminals on the printed circuit board.

The protruding terminals (2A) and (2B) of each face can be dipped in solder, for example, to prepare them for joining to a printed circuit board and/or a semiconductor chip.

In preparation of the process of joining the substrates together, the terminals of the substrates can be plated with barrier metal and anti-oxidation coatings. This process is not described in detail herein, as it is a routine procedure for one of ordinary skill in the art of electronics substrate manufacturing.

FIGS. 7A through 12B touch briefly on an exemplary manufacturing process of the exemplary device under discussion. In an embodiment, the building block substrates (1.1), (1.2), (1), (1.-1) and (1.-2) can be stacked on top of each other using spacers (3) and (4) on each end according to a predetermined terminal pitch spacing.

Figure 13:
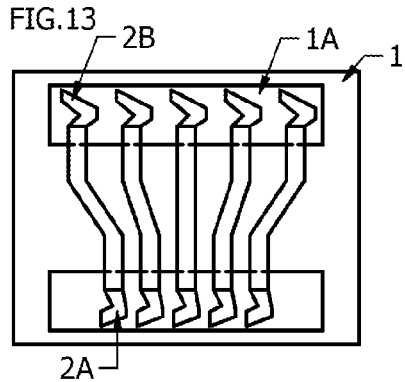
FIG. 13 shows another exemplary embodiment where the terminals have a spring-like shape to provide a wiping action.
Figure 14A:
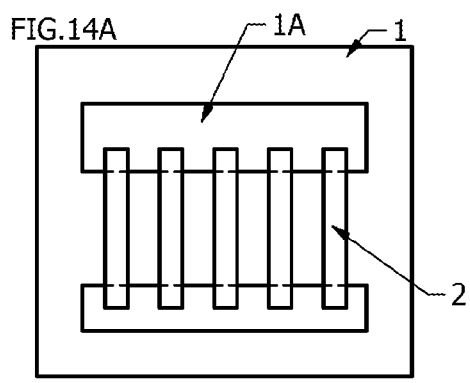
FIGS. 14A and 14B show another embodiment where there is no grid transformation. This structure creates contactors to be used between stacked semiconductor dice, semiconductor dice and printed circuit boards, or between printed circuit boards.
Figure 14B:
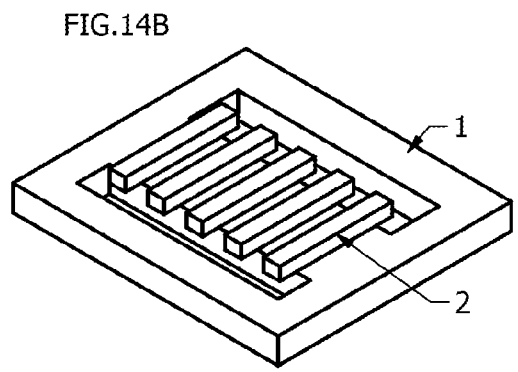
Figure 15:
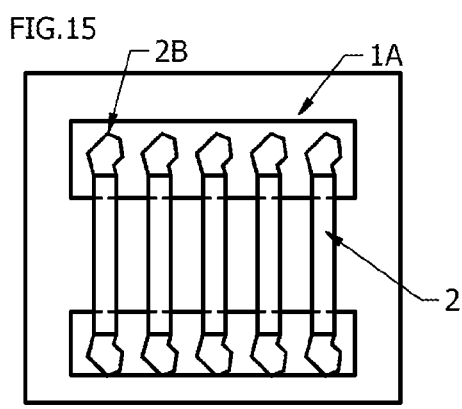
FIG. 15 is an illustration of another embodiment of the structure shown in FIGS. 14A and 14B, where the terminals have a spring-like shape for a wiping action.

In an embodiment, window openings (1A) can be formed around the conductive terminals of the substrates to expose them for better flexibility and also for practical reasons during the assembly process. The window opening locations are shown in FIGS. 13 through 15.

Figure 16A:
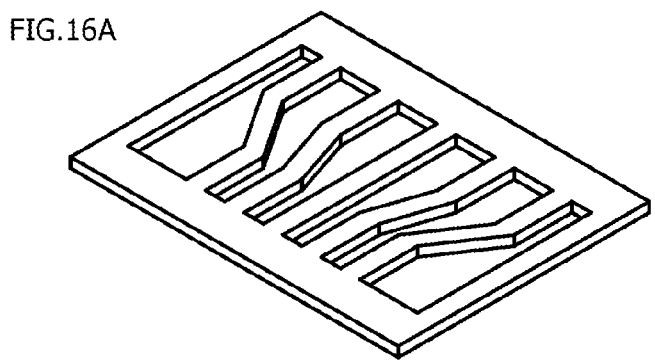
FIGS. 16A and 16B illustrate an embodiment where no dielectric substrate is used. The leads are formed on a sheet of metal and are held together by a lead frame.
Figure 16B:
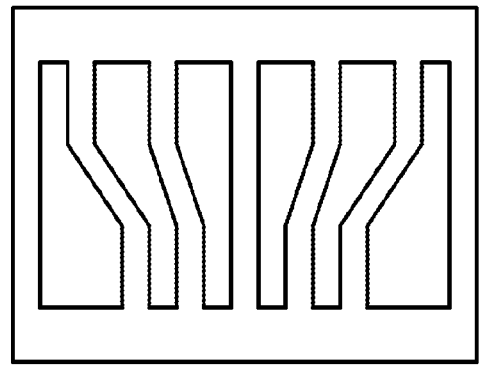
Figure 17A:
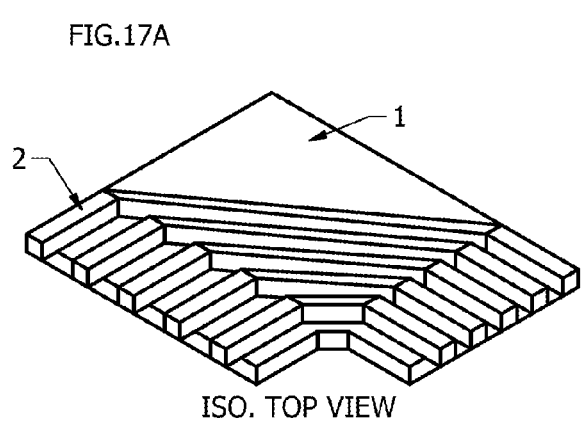
FIGS. 17A through 17D illustrate another embodiment where the terminals are at a right angle from each other.
Figure 17B:
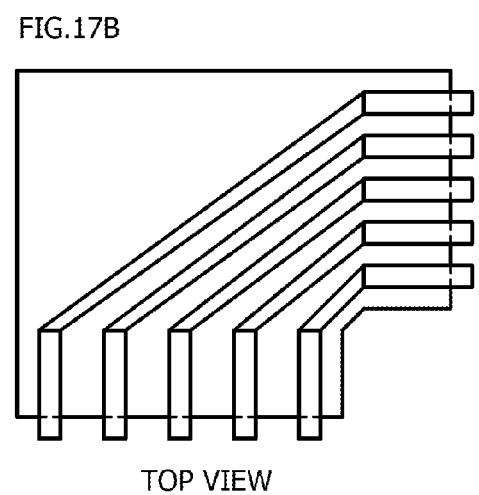
Figure 17C:
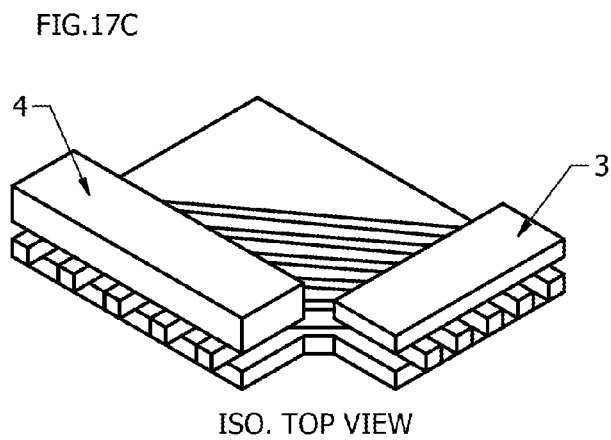
Figure 17D:
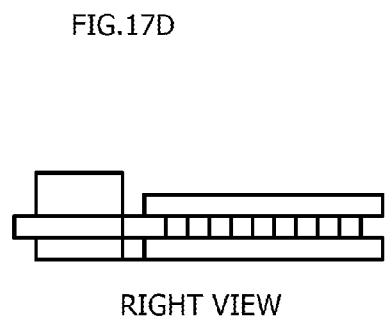
Figure 18A:
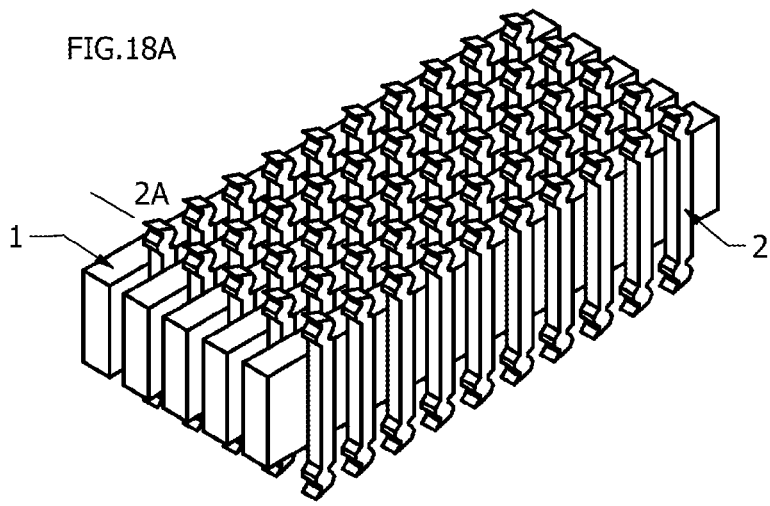
FIGS. 18A through 18D illustrate another embodiment of the interposer structure, where no grid transformation occurs.
Figure 18B:
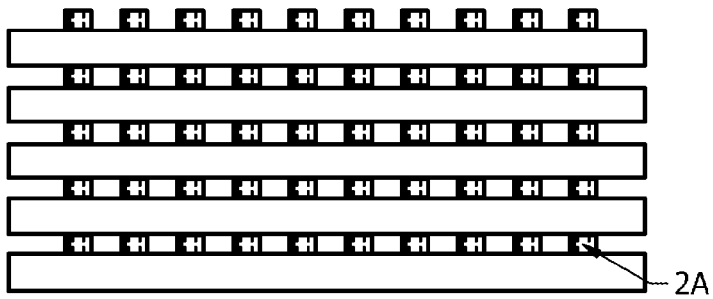
Figure 18C:
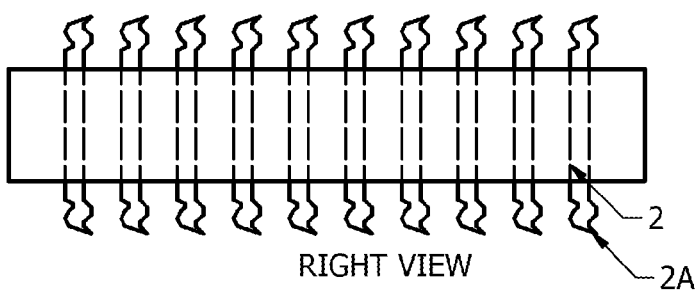
Figure 18D:
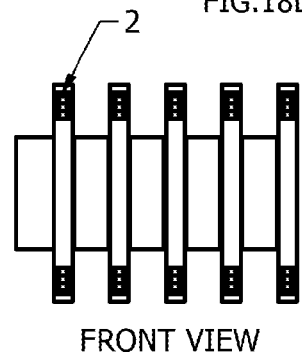
Figure 19A:
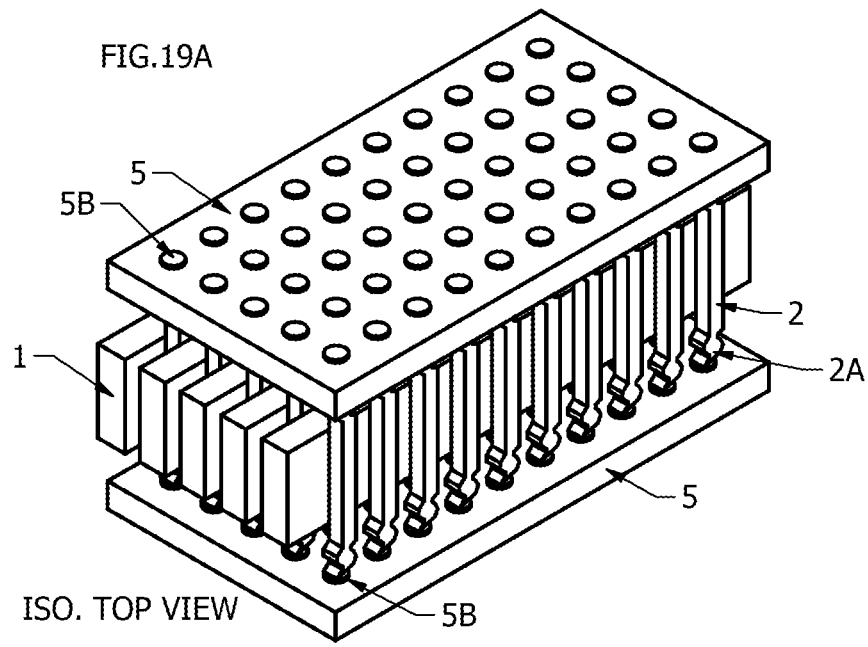
FIGS. 19A through 19D illustrate an exemplary use of the structure described in FIG. 18A, according to an embodiment of the present disclosure. Two semiconductor dice are stacked on top of each other using the exemplary structure.
Figure 19B:
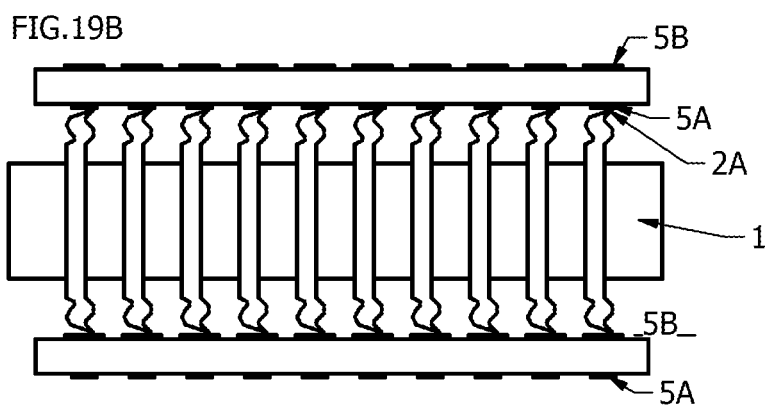
Figure 19C:
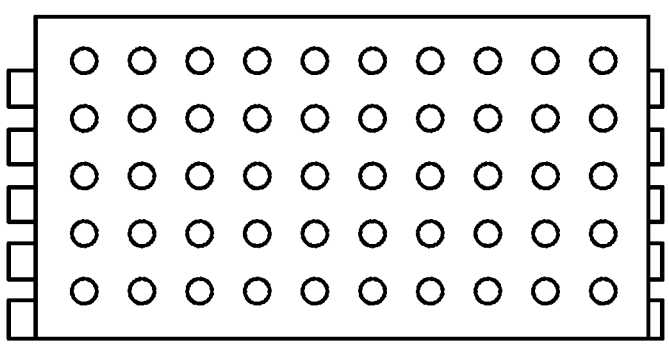
Figure 19D:
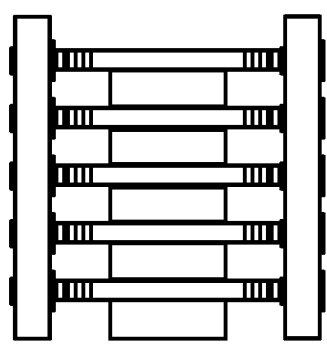

FIGS. 16A and 16B show that the substrate has been constructed from a metallic, preferably copper lead frame. A plurality of individual lead frames can be laminated on the top of each other. After lamination the structure can be sliced at a right angle adjacent to the terminals to remove the lead frame ties and thus expose the end of the terminals isolated electrically. In the format shown in the drawing everything is shorted electrically, until the slicing step.

FIGS. 9A through 11 show from different views that spacers (3) and (4) can be placed close to the terminals to create the desired pitch spacing, according to an embodiment. Though it is not shown, the spacer can have an adhesive coating on both sides or some sort of electrically non-conductive adhesive can be used to attach the spacers on the substrate.

Figure 9A:
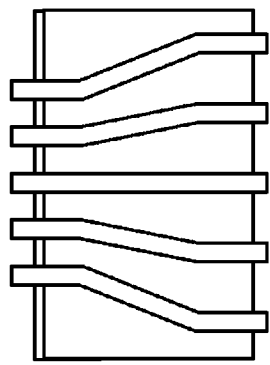
FIGS. 9A through 9D illustrate an exemplary manufacturing process of building an exemplary space transforming interposer device, according to an embodiment of the present disclosure. It shows five individual substrates placed on top of each other, as a preparation for joining them together.
Figure 9B:
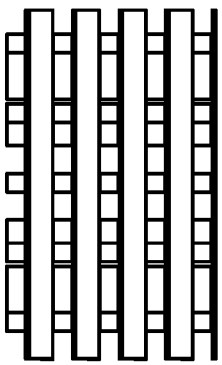
Figure 9C:
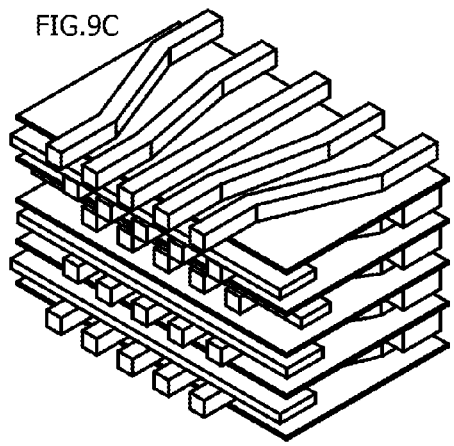
Figure 9D:
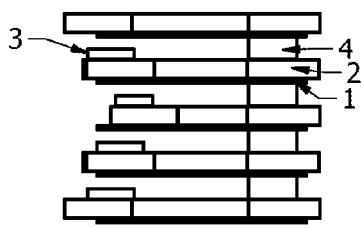
Figure 10:
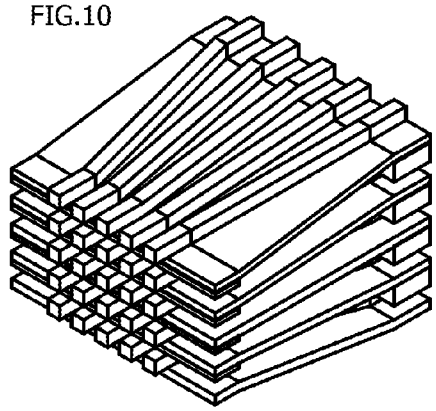
FIG. 10 illustrates the stacked substrates of FIGS. 9A through 9D after the joining/lamination process, according to an embodiment of the present disclosure.
Figure 11:
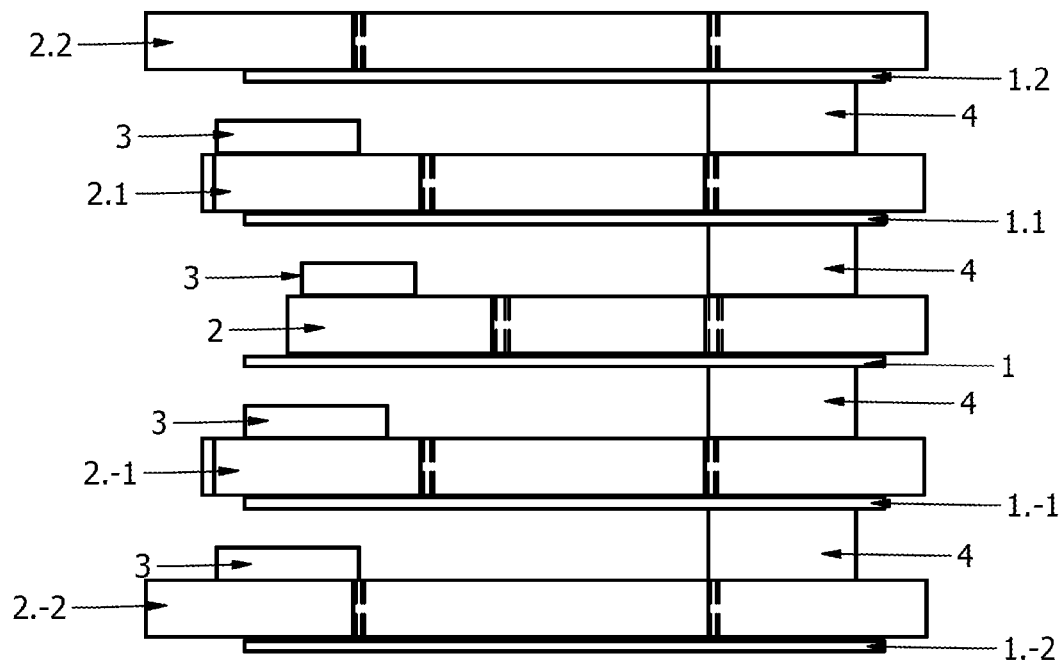
FIG. 11 illustrates another visualization of the building block substrates being stacked on top of each other before the joining/lamination process, according to an embodiment of the present disclosure. The length of each substrate is scaled by a certain value further away from the geometrical mid plane of the stack.

In FIGS. 9A and 11, though the spacers (3) are shown, it is not necessary to use spacers (3) if the combined thickness of conductive leads (2, 2,1, 2,2, 2.-1, 2.-2) and dielectric substrate (1, 1.1, 1.2, 1.-1, and 1.-2) readily provides the desired terminal pitch spacing.

FIG. 11 shows a stack of five separate substrates with spacers between each pair of adjacent substrates, according to an embodiment of the disclosure. As can be seen in the figure, the middle level substrate (1) is the shortest in the X direction. As we move farther from the geometrical mid plane, towards Y and −Y direction, each consecutive substrate size is scaled larger in the X direction: 1<1.1<1.2<...<1.n and 1<1.−1<1.−2<...<1.−n and 1.1=1.−1 and 1.2=1.−2 and 1.n=1.−n.

Figure 12A:
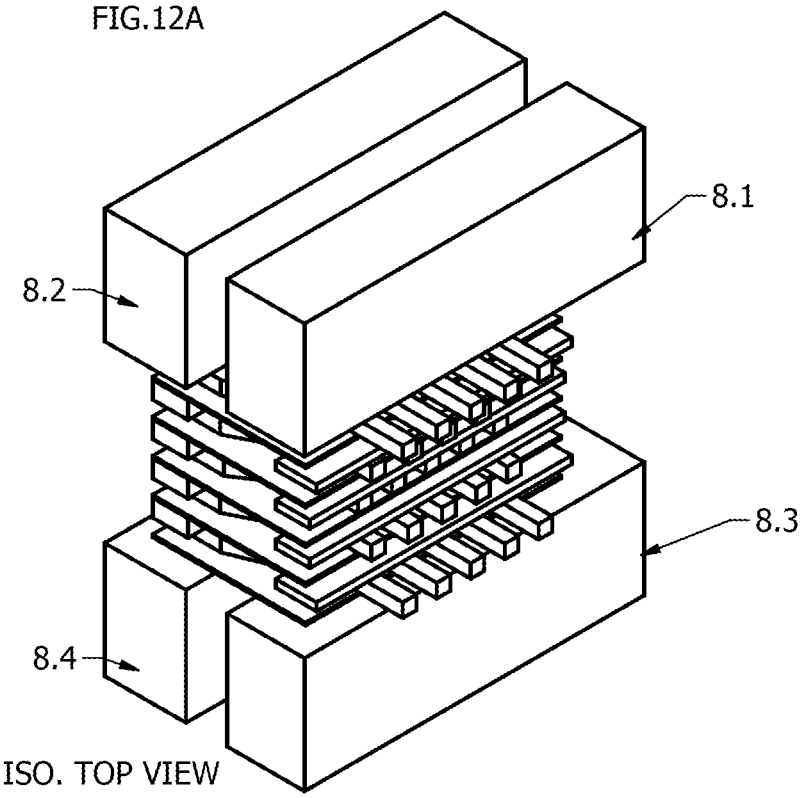
FIGS. 12A and 12B illustrate an exemplary lamination apparatus, comprising four independently movable lamination presses.
Figure 12B:
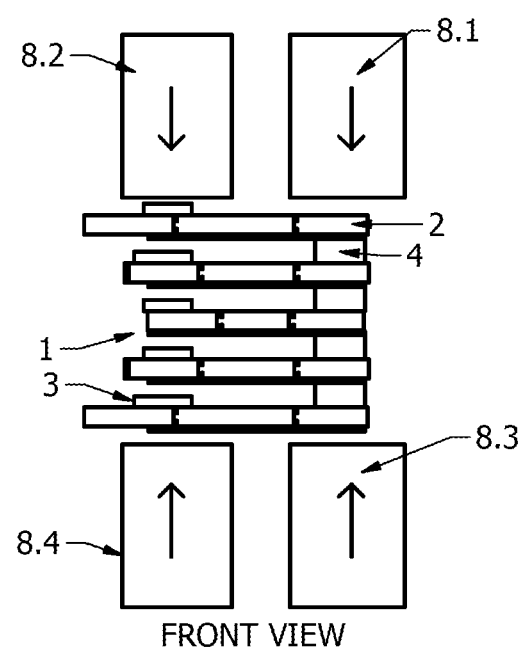

FIG. 12A shows a block diagram of a lamination fixture used to create the exemplary devices under discussion. The lamination presses (8.1) and (8.3) move in the direction shown, until they compress the substrates where the thicker spacers (4) are placed. The lamination presses (8.2) and (8.4) move synchronously with each other, until they compress the substrates at the location of the thinner spacers (3).

The above lamination process description is only exemplary. Various lamination methods and types of related equipment may exist, or could be developed to create such a lamination process.

FIGS. 17A through 17D illustrate another embodiment of the invention, where the device terminals are located at a right angle from each other. Such a structure can be used as an edge connector board.

FIGS. 18A through 18D show another embodiment of the invention where there is no grid transformation between the terminals on opposing faces. The spacer in between is optional and also could be constructed from one solid block or two different pieces. The terminals can have a spring-like shape for better flexibility and contact performance.

FIGS. 19A through 19D illustrate another embodiment of the invention, where the structure under discussion is used as a contactor device between two chips each having through-silicon vias. The structure can be either soldered or compressively be held in place to make an electrical contact to the dice signal I/O terminals 5A/5B, and thus interconnecting the I/O terminals of the dice. Using this method, a plurality of, for example, memory chips can be stacked on the top of each other, with or without using solder.

Figure 20A:
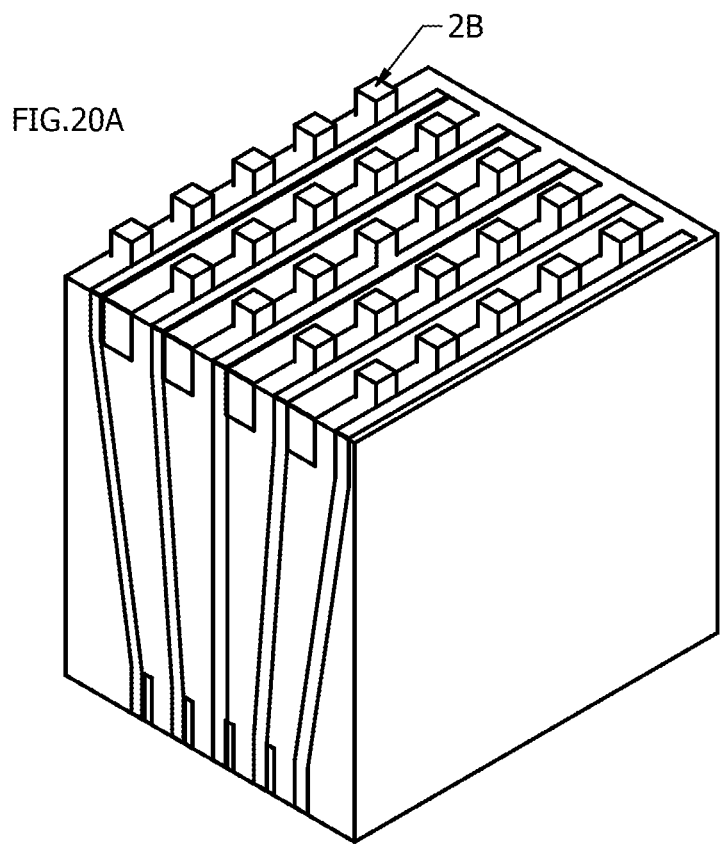
FIGS. 20A and 20B illustrate the exemplary structure housed in a molding compound.
Figure 20B:
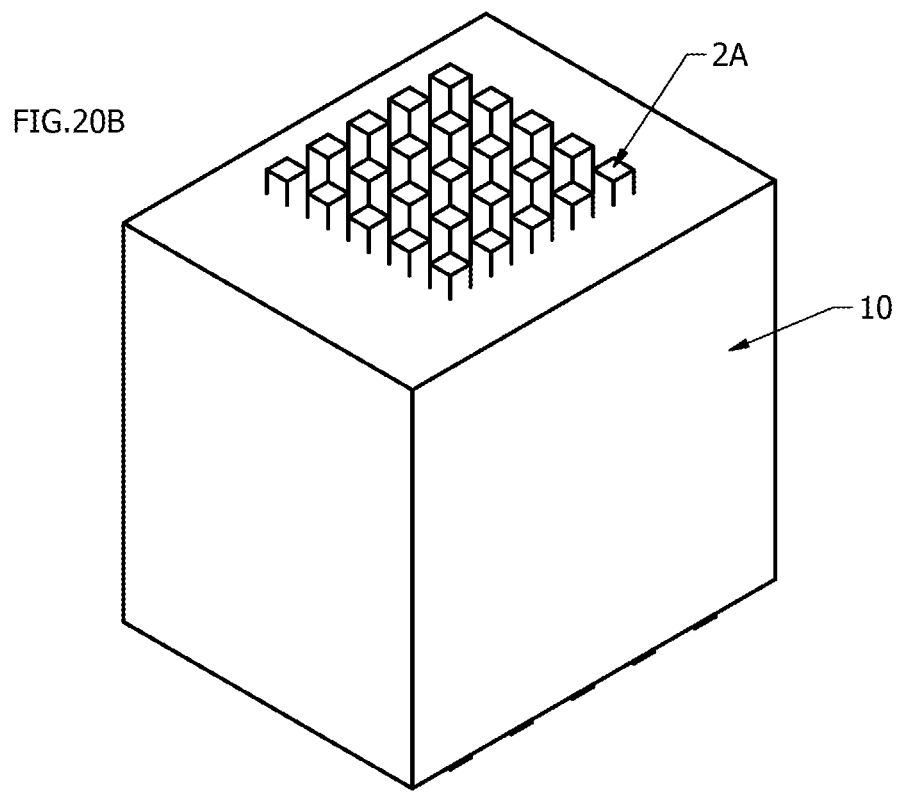

FIGS. 20A and 20B illustrate the interposer structure housed in a protective mold compound 10, exclusive of the conducting terminals. If the interposer device under discussion is used as a chip package, the terminals on one side can be attached to semiconductor chip terminals, and the entire structure can be molded in a molding compound exclusive of the conducting terminals on the other face. Molding compound can include but should not be limited to epoxies, silicon, etc.

In another embodiment the concept can be used to interconnect a grid of electrical terminals arranged on opposite sides of the same substrate. For example instead of connecting a grid of electrical contacts on two sides of a substrate such as an organic substrate (i.e., polyimide), or inorganic substrate (i.e., silicon) using plated vias, a plurality of traces can be formed either on one or both sides of the substrate. A plurality of similar or identical substrates can be laminated on top of each other. The laminated stack can subsequently be sliced into very thin slices at a right angle to the general direction of the conductors. The result will be a plurality of substrates having an arrangement of terminals on both sides, electrically connected together by solid conductive traces. This concept is an elegant alternative to, for example, plated through silicon vias.

Figure 21:
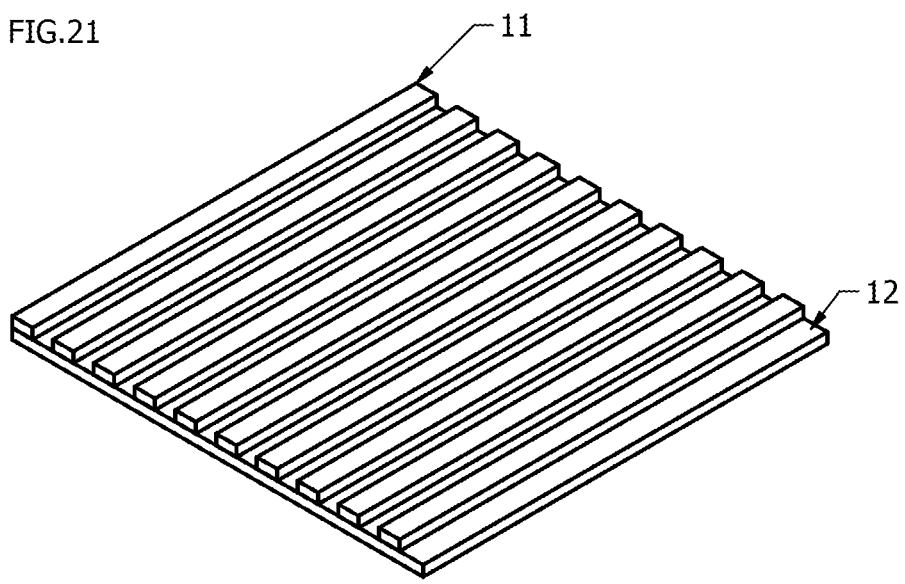
FIGS. 21 and 22 illustrate another embodiment of the disclosure, where a plurality of traces is formed on a substrate, such as a semiconductor substrate or organic substrate such as polyimide.
Figure 22:
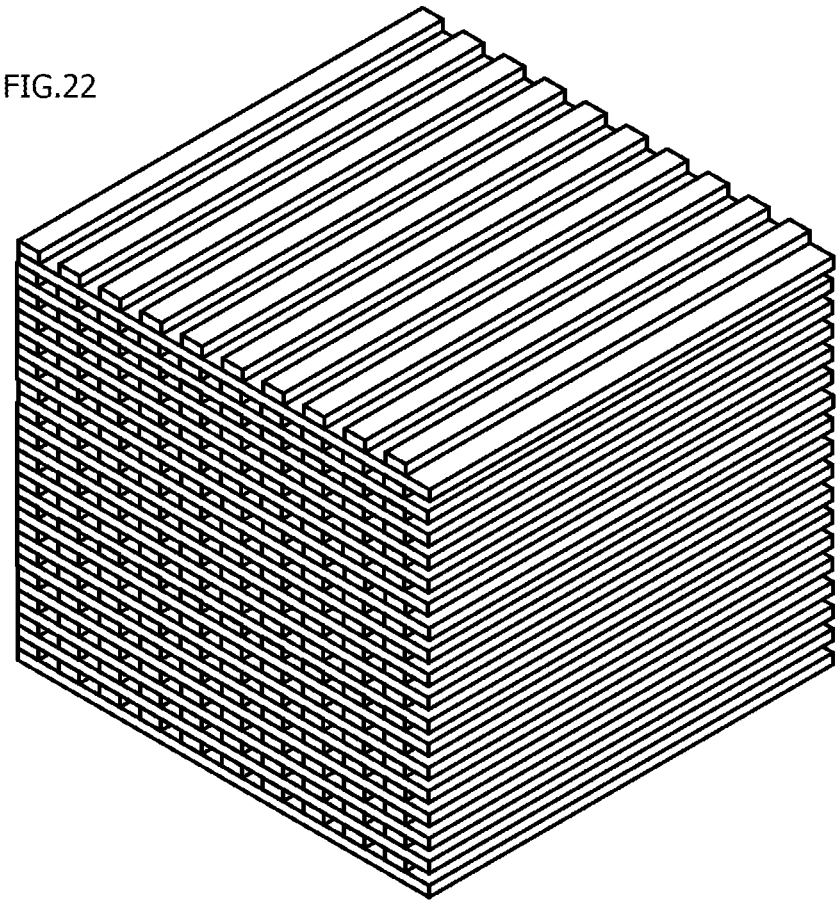
Figure 23:
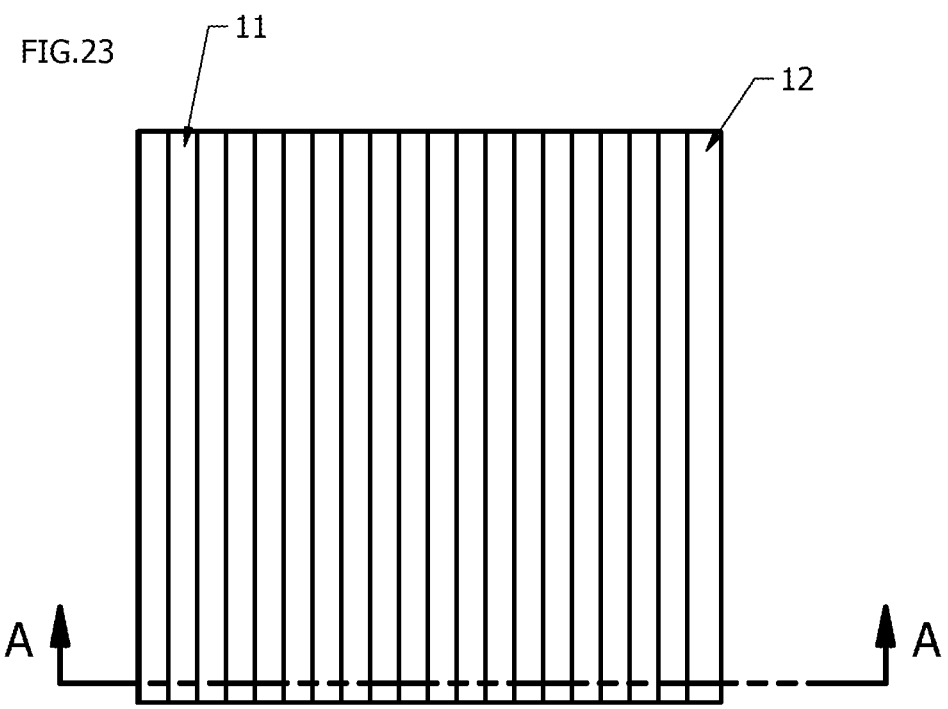
FIG. 23 shows the embodiment of FIG. 22 from a different view. The cross section A-A shown in FIG. 24 is indicated on FIG. 23.
Figure 24:
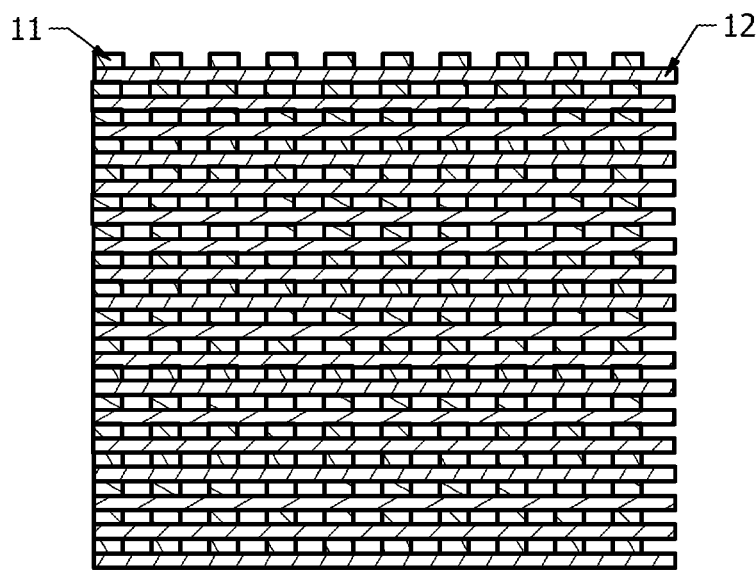
Figure 25:
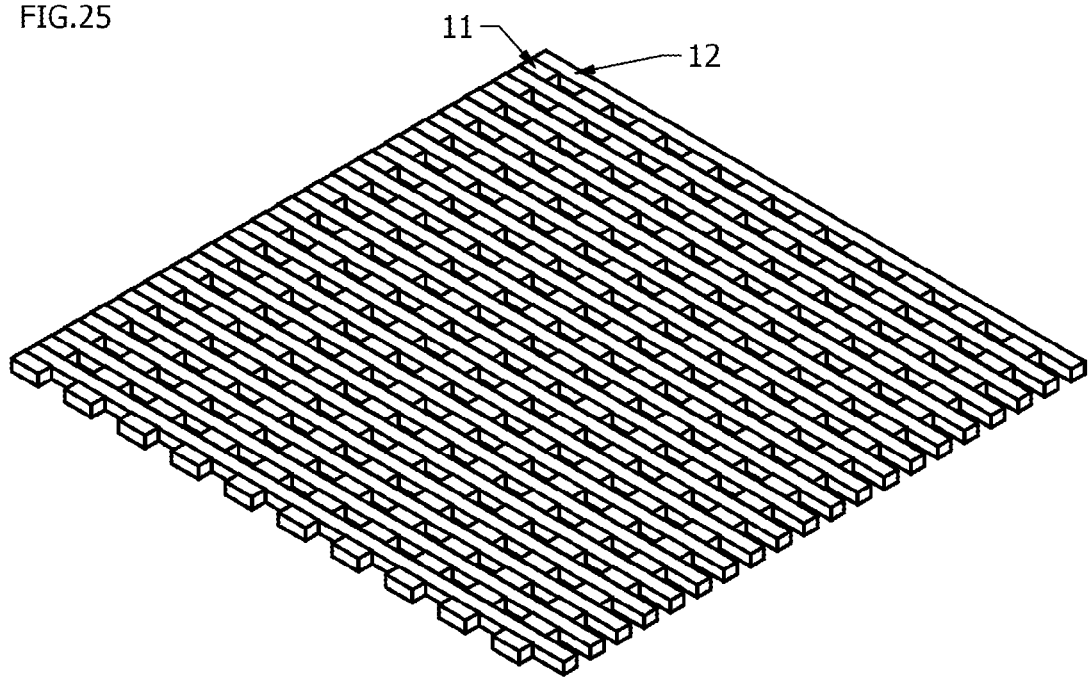
FIGS. 25 and 26 show one slice of a plurality of slices, after the structure described in FIGS. 22 through 24 has been sliced.
Figure 26:

FIG. 21 shows a single piece of substrate (12) (e.g., a silicon wafer, polyamide sheet, FR4, etc.) with traces (11) formed on at least one of the faces. FIG. 22 illustrates a plurality of such substrates joined together. FIG. 23 shows the same from a different view. FIG. 24 shows a cross section of the structure indicated by A-A on FIG. 23. FIGS. 25 and 26 show a single slice of a plurality of slices after the structure has been sliced. In FIGS. 25 and 26, contact terminals (11A) are shown. This provides an innovative replacement for a plated through via connecting a grid of terminals on both sides of substrate 12 electrically. Such a structure can be used as a replacement for preformed silicon vias, where the terminals can act as electrodes for the active semiconductor circuitry. After the terminals are formed, the resulting semiconductor substrate can be further processed to create active semiconductor circuitry such as but not limited to transistors and memory cells. In this example, line width and spaces can be as fine as on the order of nanometers and as coarse as on the order of millimeters.

The advantage of such an approach is that, for example, DRAMs (dynamic random access memory) or flash memory dice can be manufactured with preformed electrical connection between both faces of the memory semiconductor chips, so they can be stacked together to achieve higher performance and capacity.

Figure 27:
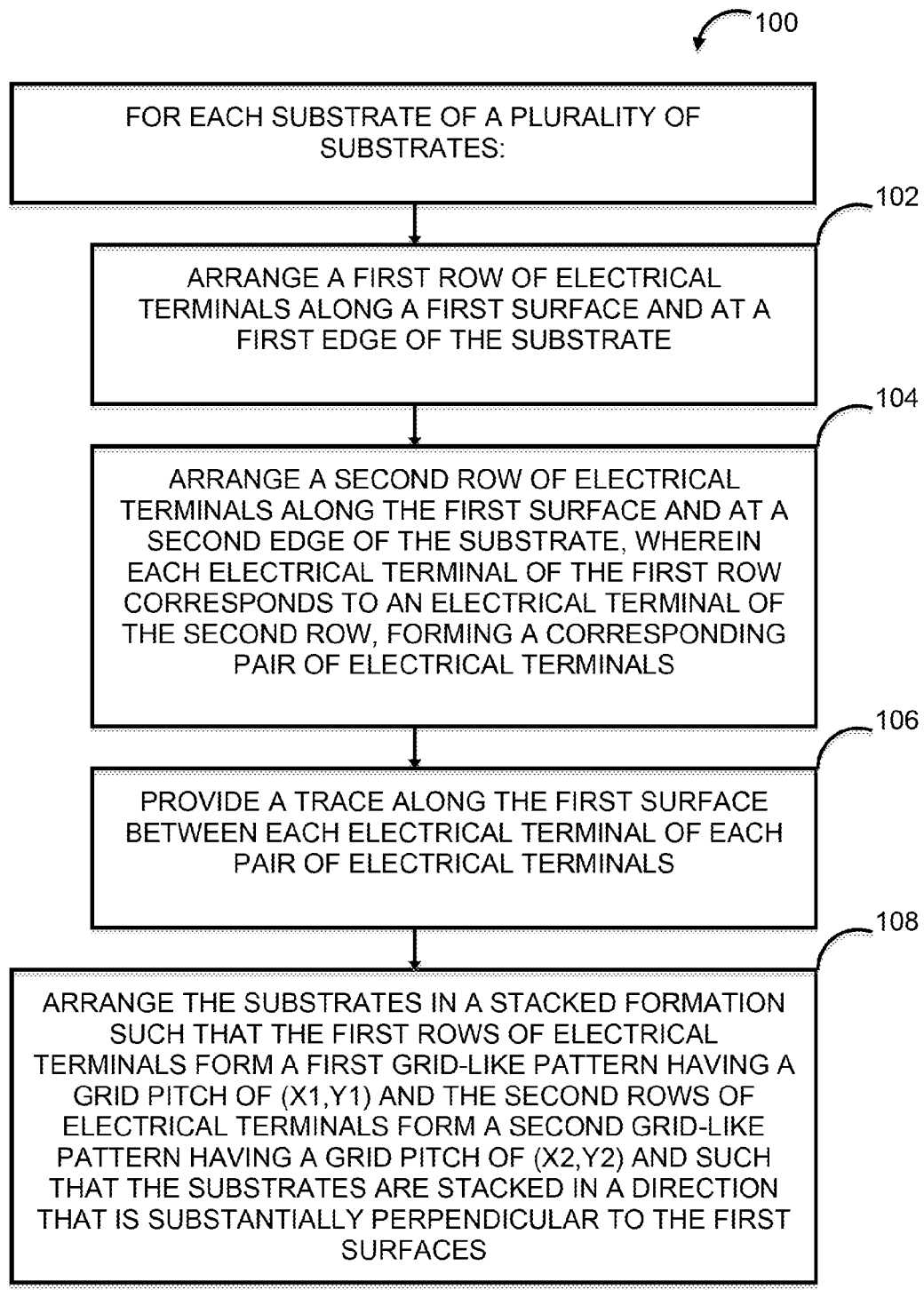
FIG. 27 depicts an exemplary method 100 of manufacturing a three-dimensional grid array interposer, according to an embodiment of this disclosure.

An exemplary method 100 of manufacturing a three-dimensional grid array interposer as described in this disclosure is shown in FIG. 27, according to an embodiment of the present disclosure. The method 100 includes, for each substrate of a plurality of substrates, arranging a first row of electrical terminals along a first surface and at a first edge of the substrate (STEP 102), arranging a second row of electrical terminals along the first surface and at a second edge of the substrate, wherein each electrical terminal of the first row corresponds to an electrical terminal of the second row, forming a corresponding pair of electrical terminals (STEP 104), and providing a trace along the first surface between each electrical terminal of each pair of electrical terminals (STEP 106). The method further includes arranging the substrates in a stacked formation such that the first rows of electrical terminals form a first grid-like pattern having a grid pitch of (X1, Y1) and the second rows of electrical terminals form a second grid-like pattern having a grid pitch of (X2, Y2) and such that the substrates are stacked in a direction that is substantially perpendicular to the first surfaces (STEP 108).

In an embodiment, method 100 could further include using spacers to provide the desired space transformation through the grid pitches. For example, a first spacer could optionally be positioned along a second surface of the substrate at the first edge, the first spacer separating the substrate from a first row of electrical terminals on a first surface of an adjacent substrate. Furthermore, a second spacer could optionally be positioned along the second surface of the substrate at the second edge, the second spacer separating the substrate from a second row of electrical terminals on a first surface of an adjacent substrate.

The method 100 could also be expanded upon to manufacture a probe card contactor, according to an embodiment of the present disclosure. For example, a first semiconductor chip could be placed across the first edges of the arranged substrates, such that at least one I/O port or terminal of the first semiconductor is electrically connected to a corresponding electrical terminal of the first rows of electrical terminals. In addition, a second semiconductor chip across the second edges of the arranged substrates, such that at least one I/O port of the second semiconductor is electrically connected to a corresponding electrical terminal of the second rows of electrical terminals.

In addition, the method 100 could be expanded upon to manufacture a stress decoupling chip package device, according to an embodiment of the present disclosure. For example, a semiconductor chip could be placed across the first edges of the arranged substrates, such that I/O ports or terminals of the semiconductor chip are electrically connected to corresponding electrical terminals of the first rows of electrical terminals, and the electrical terminals of the second rows of electrical terminals at the second edges of the arranged substrates are terminated.

For all the structures described throughout the exemplary descriptions herein, the end terminals can have any shape depending on the application. For example, they can have a spring-like shape if the concept is to be used for the creation of a probe card contactor. Even if window openings are not formed during substrate manufacturing, after the lamination and slicing, the surface of the non-conductive part can be etched selectively to create a protrusion of contactor beyond the surface, for increased contact performance.

Though this disclosure does not mention in detail differing configurations of pitch grid transformation, it is readily possible to have different (X,Y) grid pitches on the corresponding faces. For example face 1 can have a grid pitch of (X11, X12 . . . X1n and Y11, Y12 . . . Y1n), and face 2 can have a grid pitch of (X21, X22 . . . X2n and Y21, Y22 . . . Y2n), where any of these parameters can assume any manufacturable value.

It is to be noted that the depictions in the figures are not necessarily to scale. Depending on the type of application and the material or grid type being used, the grid pitch of this structure can be as fine as on the order of submicrons and as coarse as on the order of millimeters. The total thickness of the structure depending on the number of signal terminals can range anywhere from 0.05 millimeters to 50 mm. The X-Y dimensions of the final structure can range from micrometers to tens of centimeters depending on the application and the type of substrate or number of I/O terminals used.

It is also to be noted that the material of the substrate used for creating the interposer structure under discussion can consist of flexible material, such as polyimide, FR4, etc.; or rigid material such as silicon, ceramics or glass, depending on the practical applications or a particular design. For example if grid transformation is to be achieved, it is not practical to use rigid substrate material, since it cannot be bended, unless relief slots are formed on the rigid substrate.

Those skilled in the art will recognize improvements and modifications to the preferred embodiments of the present disclosure. All such improvements and modifications are considered within the scope of the concepts disclosed herein and the claims that follow.

What is claimed is:

1. A three-dimensional grid array interposer, comprising:
a first array of electrical terminals arranged in a grid-like pattern having a first grid pitch of (X1, Y1);
a second array of electrical terminals arranged in a grid-like pattern having a second grid pitch of (X2, Y2), wherein each electrical terminal of the first array corresponds to a corresponding single electrical terminal of the second array, forming an exclusive corresponding pair of electrical terminals;
a plurality of substrates, each substrate having a first surface, a second surface, a first edge, and a second edge, with each substrate having a row of electrical terminals of the first array along the first surface at the first edge and a row of electrical terminals of the second array along the first surface at its second edge, wherein a trace runs along the first surface between the two electrical terminals of each corresponding pair of electrical terminals exclusively, and wherein the substrates are stacked in a Y direction that is substantially perpendicular to the first surfaces; and
a plurality of second-array spacers, each second-array spacer positioned along the second surface of a corresponding substrate at the second edge of the corresponding substrate, the second-array spacer separating the corresponding substrate from the row of electrical terminals of the second array of electrical terminals on the first surface of an adjacent substrate, and wherein the plurality of second-array spacers provide grid pitch spacing of the second grid pitch of the second array in the Y direction.

2. The interposer of claim 1, further comprising:
a plurality of first-array spacers, each first-array spacer positioned along the second surface of a corresponding substrate at the first edge of the corresponding substrate, the first-array spacer separating the corresponding substrate from the row of electrical terminals of the first array of electrical terminals on the first surface of the adjacent substrate, wherein the first-array spacers provide grid pitch spacing of the first grid pitch of the first array in the Y direction.

3. The interposer of claim 2, wherein a thickness of the first-array spacer differs from a thickness of the second-array spacer.

4. The interposer of claim 2, wherein a coefficient of thermal expansion of the first-array spacer differs from a coefficient of thermal expansion of the second-array spacer.

5. The interposer of claim 1, wherein X1<X2 and Y1<Y2.

6. The interposer of claim 2, wherein X1<=X2 and Y1<=Y2.

7. The interposer of claim 3, wherein X1=X2 and Y1=Y2.

8. The interposer of claim 1, wherein the first and second arrays of electrical terminals and their associated traces are comprised of solid continuous conductors.

9. The interposer of claim 8, wherein the first and second arrays of electrical terminals and their associated traces are comprised of metallic conductors.

10. The interposer of claim 1, wherein at least one of the first and second arrays of electrical terminals extends beyond a corresponding end of the plurality of substrates.

11. The interposer of claim 1, wherein the electrical terminals have a spring-like shape.

12. The interposer of claim 1, wherein the substrates are flexible dielectric substrates.

13. The interposer of claim 1, wherein the substrates are lead frame metallic substrates.

14. The interposer of claim 1, wherein the substrates are comprised of a rigid substrate material.

15. The interposer of claim 14, wherein the substrates are comprised of silicon.

16. The interposer of claim 14, wherein the substrates are comprised of ceramic.

17. The interposer of claim 14, wherein the substrates are comprised of glass.

18. The interposer of claim 1, wherein the interposer, exclusive of the electrical terminals, is housed in a molding compound.

19. A method of manufacturing a three-dimensional grid array interposer, the method comprising: for each substrate of a plurality of substrates, arranging a first row of electrical terminals along a first surface and at a first edge of the substrate; arranging a second row of electrical terminals along the first surface and at a second edge of the substrate, wherein each electrical terminal of the first row corresponds to a corresponding single electrical terminal of the second row, forming an exclusive corresponding pair of electrical terminals; providing a trace along the first surface between the two electrical terminals of each pair of electrical terminals; and positioning a spacer along a second surface of the substrate at the second edge; and arranging the substrates in a stacked formation such that the first rows of electrical terminals form a first grid-like pattern having a grid pitch of (X1,Y1) and the second rows of electrical terminals form a second grid-like pattern having a grid pitch of (X2,Y2) and such that the substrates are stacked in a Y direction that is substantially perpendicular to the first surfaces, wherein each spacer separates a corresponding substrate from the second row of electrical terminals on the first surface of an adjacent substrate providing grid pitch spacing of the second grid-like pattern in the Y direction.

20. The method of claim 19, further comprising, for each substrate,
positioning an additional spacer along the second surface of the substrate at the first edge, the second spacer separating the substrate from the first row of electrical terminals on the first surface of an adjacent substrate providing grid pitch spacing of the first grid-like pattern in the Y direction.

21. The interposer of claim 1, wherein grid pitch spacing of the first array and the second array in an X direction is provided by fanning the traces that run along the first surface of each substrate, wherein the X direction is substantially parallel to the first surface.

22. The interposer of claim 1, wherein the first and second edges of each substrate are opposite edges.

23. The interposer of claim 1, wherein the first and second edges of each substrate are adjacent edges.

* * * * *